US005679444A

United States Patent [19]
Davis et al.

[11] Patent Number: 5,679,444
[45] Date of Patent: Oct. 21, 1997

[54] METHOD FOR PRODUCING MULTI-LAYER CIRCUIT BOARD AND RESULTING ARTICLE OF MANUFACTURE

[75] Inventors: Charles Robert Davis, Wappingers Falls; Thomas P. Gall, Lancester, both of N.Y.

[73] Assignee: International Business Machines Corporation, Armonk, N.Y.

[21] Appl. No.: 679,874

[22] Filed: Jul. 15, 1996

[51] Int. Cl.⁶ .................. B32B 3/00; B32B 5/12; B32B 5/22; H05K 1/03
[52] U.S. Cl. .............. 428/209; 428/317.1; 428/317.5; 428/317.9; 428/344; 428/421; 428/901; 174/256; 174/259; 361/748; 361/750
[58] Field of Search .................. 428/209, 344, 428/421, 317.1, 317.5, 317.9, 901; 174/256, 259; 361/739, 746, 750, 748, 450

[56] References Cited

U.S. PATENT DOCUMENTS

| | | | |
|---|---|---|---|
| 4,640,866 | 2/1987 | Suzuki | 174/259 |
| 4,781,969 | 11/1988 | Kobayashi et al. | 361/750 |
| 4,886,699 | 12/1989 | Carroll et al. | 174/256 |
| 4,985,297 | 1/1991 | Tamaru et al. | 428/260 |
| 5,077,136 | 12/1991 | Shyu | 428/473.5 |
| 5,103,293 | 4/1992 | Bonafino et al. | 357/80 |
| 5,230,937 | 7/1993 | Effenberger et al. | 428/113 |
| 5,338,608 | 8/1994 | Resnick | 428/392 |
| 5,347,710 | 9/1994 | Gall et al. | 29/830 |
| 5,358,775 | 10/1994 | Horn, III | 361/750 |
| 5,379,193 | 1/1995 | Gall et al. | 361/784 |

FOREIGN PATENT DOCUMENTS 63-145341  6/1988  Japan.

Primary Examiner—Patrick Ryan
Attorney, Agent, or Firm—Michele A. Mobley; Jenkens & Gilchrist; Lawrence R. Fraley

[57] ABSTRACT

A method for producing a panel of a multi-layer electronic circuit package and resulting article of manufacture is provided comprising the steps of coating a circuitized core material that has been cut into panels with a dielectric material and copper cover sheets; forming circuits from the cover sheets by etching; applying an adhesive polymer across the dielectric material covering the entire area of the panel; applying a cover sheet; drilling the panel to form through-holes and vias; seeding and plating the through-holes and vias with joining metal; applying photo-resist to the panels exposed with an image of the area of the panel to be joined and developed; and etching the cover sheet and the photo-resist away in the area of the panel to be joined to expose the adhesive polymer.

5 Claims, 2 Drawing Sheets

METHOD FOR PRODUCING MULTI-LAYER CIRCUIT BOARD AND RESULTING ARTICLE OF MANUFACTURE

TECHNICAL FIELD OF THE INVENTION

The present invention relates to a method for producing a panel of a multi-layer circuit board having a thin dielectric layer comprising a select group of adhesive polymers such as poly tetra-fluoroethylene-perfluorovinyl ether) ("PFA") to insulate the panels of the multi-layer board and thereby permit higher wiring densities and faster signal propagation speeds while preventing spurious diffusion of chemicals used in the fabrication process into the dielectric and the core material. Also claimed is the resulting article of manufacture. More particularly, the invention relates to plating and circuitizing a core material, then coating the core material with a dielectric material and an adhesive polymer. By repeating these steps, additional panels of a multi-layer circuit board can be added, each panel having one or more layers that are impervious to chemical diffusion.

BACKGROUND OF THE INVENTION

Electronic circuits contain many (sometimes millions) of components such as resisters, capacitors, inductors, diodes, electro-mechanical switches, and transistors. High density packaging of electronic components is particularly important to allow fast access to large amounts of data in computers. The components are connected to form circuits and circuits are connected to form functioning devices. The connections perform power and signal distribution. The devices require mechanical support and structural protection. The circuits themselves require electrical energy to function. The functioning devices, however, produce heat, or thermal energy which must be dissipated so that the devices do not stop functioning. Moreover, while high density packaging of a number of components can improve performance of the device, the heat produced by the power-consuming components can be such that performance and reliability of the devices is adversely impacted. The adverse impact arises from electrical problems such as increased resistivity and mechanical problems such as thermal stress caused by increased heat.

A further performance-related issue is that the layers of the electronic circuit package are exposed to various chemicals commonly used in fabrication of the electronic circuit package and in fabrication of the device. When the chemicals are absorbed into the electronic circuit package, various problems can occur such as (1) sporadic plating and (2) blistering during additive plating, plasma cleaning, photo-resist lamination and baking processes.

High density packages necessarily involve increased wiring density and thinner dielectric coatings between layers in a multi-layer electronic circuit package. The layers in a multi-layer package are electrically connected by vias and through-holes. The term "via" is used for a conductive pathway between adjacent layers in a multi-layer electronic circuit package. The term "through-hole" is used for a conductive pathway that extends to a non-adjacent layer. For high density packages the vias and through-holes are increasingly narrow in diameter and the vias and through-holes in each layer must be aligned precisely.

Electronic circuit packages, such as chips, modules, circuit cards, circuit boards, and combinations of these, thus must meet a number of requirements for optimum performance. The package must be structurally sturdy enough to support and protect the components and the wiring. In addition, the packages must be capable of dissipating heat and must be impervious to various chemicals used in the fabrication process. Finally, the package should be inexpensive to produce and easy to manufacture.

The prior art contains many examples of electronic circuit packages. These packages can be generally classified into packages with either a ceramic dielectric coating between layers or those with a polymeric dielectric coating between layers. The dielectric coating serves as insulation between the layers both for heat and for electrical related purposes. One type of polymeric package is a metal core package—namely a package with aluminum, copper, molylbdenum, or copper-Invar-copper or an alloy of these as the core metal, which is then encapsulated in a polymeric dielectric. A common dielectric material used in the manufacture of electronic circuit packages is a silica filled poly (tetrafluoroethylene) ("PTFE") composite.

There are several disadvantages, however, associated with the silica/PTFE composite. The adhesion of silica to PTFE is poor, thus a porous composite is formed. The composite, therefore, absorbs chemicals commonly used in electronic circuit package fabrication and device fabrication. In addition, the adhesion of the silica/PTFE composite to the other materials of the circuit package, such as the circuitized core, is not ideal. To promote adhesion, heat treatment at temperatures greater than 327° C. and increased pressure is commonly used. Alternatively, it is known in the art to selectively place a high temperature polymeric adhesive such as PFA in the area of the package known as the "rigid-card" or "chip carrier" region.

SUMMARY OF THE INVENTION

It is an object of this invention to provide a method for producing an electronic circuit package with a dielectric material that is coated with material to form a barrier to spurious chemicals entering the dielectric material or the core material.

A further object of this invention is to provide a method for producing an electronic circuit package with a dielectric material that is coated with an adhesive polymer which, when the adhesive polymer is selectively exposed, forms a well-defined adhesive region useful in attaching components or additional panels (i.e. layers) in the fabrication of multi-layer electronic circuit packages.

A third object of this invention is to provide an article of manufacture known as an electronic circuit package with a dielectric material that is coated with an adhesive polymer which forms a barrier to spurious chemicals entering the dielectric material or the core material and in which the adhesive polymer can be selectively exposed to form a well-defined adhesive region useful in attaching additional panels (i.e. layers) in the fabrication of multi-layer electronic circuit packages.

Accordingly, a method is provided for producing a panel of a multi-layer electronic circuit package and resulting article of manufacture comprising the steps of coating a circuitized core material that has been cut into panels with a dielectric material; applying an adhesive polymer across the dielectric material covering the full size of the panel; applying a copper cover sheet; drilling the panel to form through-holes and vias; seeding and plating the vias with joining metal; applying photo-resist to the panels exposed with an image of the area of the panel to be joined and developed; and etching the cover sheet and the photo-resist away in the area of the panel to be joined to expose the adhesive polymer. Also claimed is the resulting article of manufacture known as an electronic circuit package.

It is an advantage of the present invention that the adhesive polymer protects the dielectric and the core material from extraneous chemicals thereby preventing sporadic plating problems and blistering problems.

It is a further advantage that the adhesive polymer functions as a means of attaching components or additional layers since the copper cover sheet and photo-resist are etched away in the area of the panel to be joined such that the adhesive polymer is exposed.

Other features and advantages of the present invention will become apparent in the following detailed description of the preferred embodiment of the invention taken in conjunction with the accompanying drawings.

DETAILED DESCRIPTION OF A PREFERRED EMBODIMENT OF THE INVENTION

Figure 1:
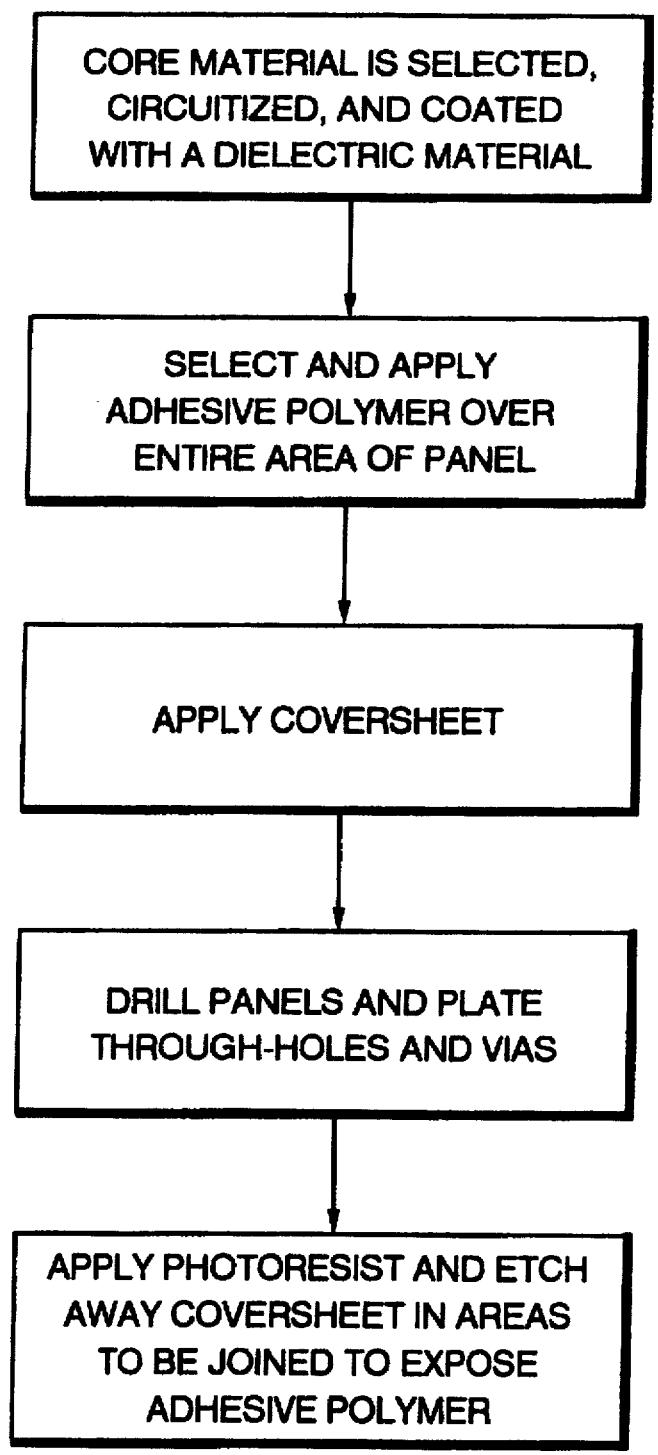
FIG. 1 is a flow chart showing the steps in the preferred embodiment of the method for producing a multi-layer electronic circuit package of the present invention.

The present invention is of a method for producing an electronic circuit package. FIG. 1 summarizes in very general terms the steps involved in the method to produce one panel to be used in conjunction with other panels to form a multi-layer electronic circuit package. The method for making a circuit board for which this invention is primarily used is described in detail in U.S. Pat. No. 5,379,193 to T. Gall, et al.; and in U.S. Pat. No. 5,347,710 to T. Gall, et al. Those patents are incorporated herein by reference. The present invention is not, however, limited to those particular packaging methods. Accordingly, FIG. 1 describes generally the steps involved in producing a multi-layer circuit board. As shown in FIG. 1, in the first step, a core material is selected, circuitized, and coated with a dielectric material. The core material typically will be a metal such as copper, molybdenum, or an iron/nickel alloy such as copper-Invar-copper.

Each of these core materials has a low coefficient of expansion which is desirable in high density electronic packaging. The coefficient of thermal expansion of the core material should match that of the devices to be mounted on the package. For direct chip attach or silicon on silicon carriers this would be 2.5 to 3.3 ppm/oc. Each of these core materials is commercially available in a number of forms, including panels, sheets, foils and coils. The core material used in the preferred embodiment of the present invention typically will be 0.005" in thickness.

The core material is formed into panels suitable for the intended application. In general terms, the panels are cut to size, drilled, etched, and/or punched as needed for the intended application.

The formed panels typically are then cleaned. The panels may be cleaned in a number of ways, including by the use of a warm caustic solution and/or acid treatment such as an oxalic/phosphoric acid solution. The surface of the metal core material thus will be free of dirt, grease, or other contaminants, and will have an oxide treatment to promote adhesion of the dielectric. The preferred embodiment of the invention uses a sodium chlorite cleaning treatment.

The core material in some applications will be plated with copper to improve heat transfer. The plating may be complete plating or selective plating. The plating may be performed in a number of ways, including an acid or an additive copper plating bath.

Plating with a copper foil of a thickness of 35 microns (which is one-ounce foil) is commonly used in the manufacture of printed circuit boards. Plating should be carried out at a low current density to achieve uniform plating thickness and to minimize thermal stresses. For some applications, to improve adhesion and stress relief of the copper plated panels, the panels are subjected to heat treatment. The heat treatment is important to ensure adequate bonding of the copper plating with the metal core. The heat treatment process is known as annealing.

As the final stage of step 1, the panels are ready to be "personalized" for the intended application. The process of personalizing the panels is known as "circuitization." Circuitization will vary widely depending on the intended application. During circuitization, a dielectric material will be applied uniformly across both sides of the core material.

Polymeric dielectrics are used as insulation layers between the multiple power and signal planes of a multi-layer electronic circuit package. Many suitable dielectric materials are commercially available, including photoimageable ones and nonphotoimageable ones. The dielectric material typically will have a dielectric constant of 3.2 or less to reduce signal propagation delays and to reduce signal noise. The selected dielectric may be applied in one of several ways, including lamination, spraying, screening, or dipping. If screening is performed using a nonphotoimageable dielectric, photoimaged screens should be used to eliminate subsequent drilling to form vias. Dielectric coatings are well-known in the art. See, for example, Brauer, et al., U.S. Pat. No. 5,153,986 and Bindra, et al., U.S. Pat. No. 5,229,550. Examples of suitable dielectrics include, but are not limited to fluoropolymers.

In the preferred embodiment of the invention, the dielectric used is silica filled poly(tetrafluoroethylene) ("PTFE"). Also, in the preferred embodiment of the invention, the dielectric material is applied to both sides of the core material.

At this point circuits are formed on the surface of the panel by etching or selective plating.

In the second step adhesive polymer is coated over the circuitized core, covering the entire area of the panel. The polymer selected should have adhesive properties and should be impenetrable by chemicals used in fabrication of circuit boards and in fabrication of devices using circuit boards. In the preferred embodiment of the invention, the adhesive polymer should be applied on top of the dielectric material on both sides of the core material. It is known in the art to use an adhesive polymer selectively in the area of the panel to be joined to other panels or components used in the multi-layer electronic circuit package. The present invention, however, contemplates applying the adhesive polymer across the entire area of the panel. The usefulness of the adhesive polymer in protecting the electronic circuit package from chemicals had not been previously recognized.

In the preferred embodiment of the invention, the adhesive polymer is poly(tetrafluoroethylene-perfluorovinyl ether) ("PFA"). PFA is chemically inert and provides excellent thermal stability. It is thus an ideal adhesive polymer for use in multi-layer electronic circuit packages.

The adhesive polymer coating serves two purposes. First, it bonds with the dielectric to form a protective layer around the dielectric and core material that is impervious to chemicals. Chemicals used in other stages of the electronic circuit package manufacturing process, or in the manufacturing process of devices that use electronic circuit packages, thus cannot penetrate into the dielectric or reach the core material. Problems such as (1) sporadic plating and (2) blistering during additive plating, plasma cleaning, photo-resist lamination, and baking processes thus are avoided. Without the adhesive polymer layer, infiltration of chemicals is a known problem since glass filled dielectric materials are porous.

A second purpose of the adhesive polymer is that when selectively exposed it serves as an adhesive useful in multi-layer fabrication since it promotes dielectric bonding and thus can be used to join components and panels used in a multi-layer electronic circuit package.

The key properties of the polymer are (1) thermoplastic polymer so that it will adhere to the cover sheet, and can later be used to stick together multiple layers in a composite panel; (2) low dielectric constant (<3.2); and (3) lower melting point than first layer of dielectric. Fluoropolymers are the best group of polymers for this application.

In the third step a cover sheet is placed on both sides of the panel. In the preferred embodiment of the invention, the cover sheet is made of copper of 9 micron thickness. The cover sheet is attached by the adhesive polymer. The cover sheet is used as a commoning layer for electroplating.

In the fourth step, the panels are drilled as appropriate for the intended application. The drilling process provides through-holes and vias to connect electrically one layer to another in a multi-layer electronic circuit package.

Also in the fourth step, the through-holes and vias are seeded with a catalyst using via screening. The metal seed layer starts a via stud. The metal seed layer typically is selected from a group comprising palladium and tin, or alloys thereof.

The through-holes and vias, as defined by the metal seed layers, can be filled with an electrically conductive metal material known as joining metal. The metal material could be of the same material or a different material as that used for the metal seed layer. The joining metal material in the preferred embodiment of the invention is selected from a group comprising gold and tin. The through-holes and vias can be filled with the metal in a variety of methods, including, for example, electroplating, sputtering, or evaporation. The surface of the layer then may be planarized to remove the excess metal material and the seed metal layer from all areas other than the vias themselves. Planarization typically is done by polishing, such as using a chem-mech polishing technique.

In the fifth step, photo-resist is applied to the panel. The panel is then exposed with an image of the area of the panel to be joined and developed. The cover sheet then is etched away in the area of the panel to be joined and the photo-resist is removed. This exposes the adhesive polymer for use in multi-layer fabrication. The exposed adhesive polymer then is available to attach other components or additional panels to form a multi-layer electronic circuit package.

Figure 2:
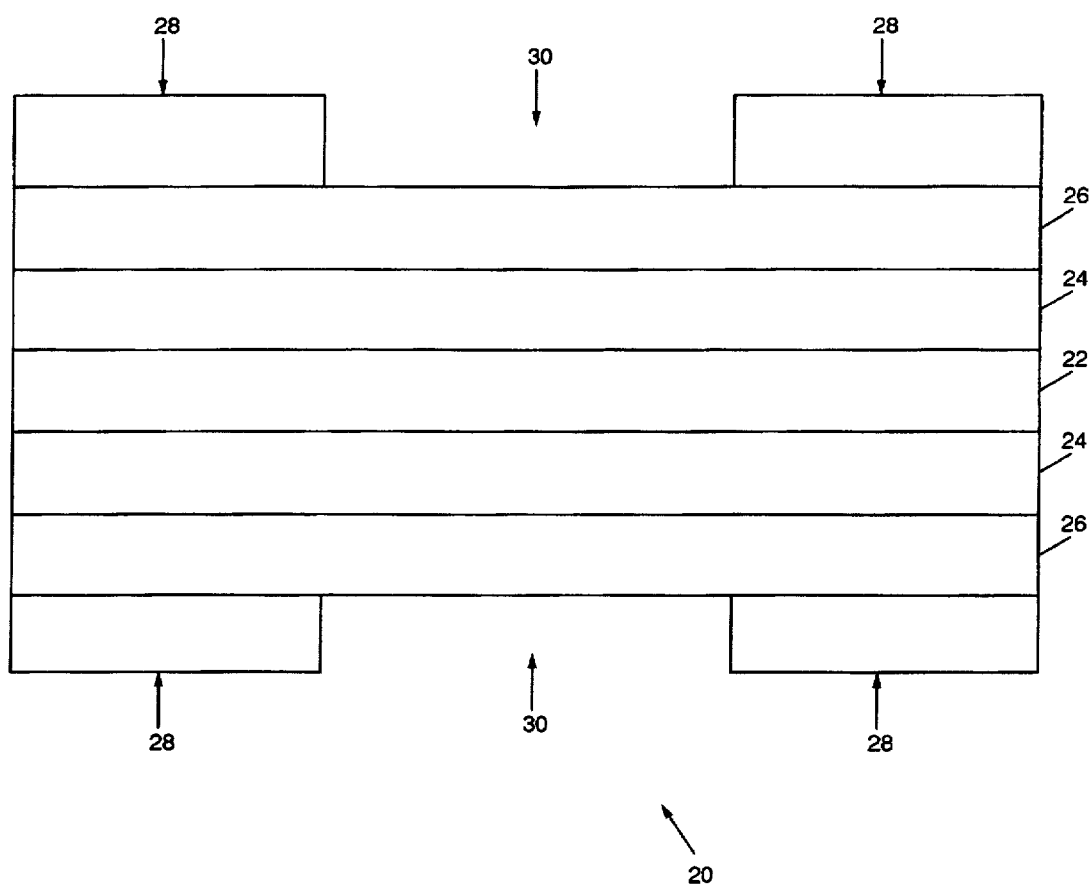
FIG. 2 is a depiction of a single panel of a multi-layer circuit board of the present invention.

FIG. 2 shows an expanded view of a sample single panel 20 of an electronic circuit package of the present invention. In FIG. 2, the circuitized core material 22 is at the center of the panel. The core material typically will be a metal such as aluminum, copper, molybdenum, or an iron/nickel alloy such as copper-Invar-copper. In the preferred embodiment of the invention, the core material is copper-Invar-copper. The core material 22 has been formed into panels suitable for the intended application by cutting to size, drilling, etching and/or punching as needed. The core material 22 also has been cleaned to remove all contaminants prior to continuing with the process of preparing a multi-layer electronic circuit package. The circuitized core material 22 of the preferred embodiment has two layers of dielectric material and two layers of copper circuit lines not shown in FIG. 2.

The core material 22 may have been plated with copper plating to improve heat transfer. The plating may be complete or selective plating and may be performed in an acid or an additive copper plating bath. The copper plating, if used for the particular application, is likely to be in the range of 25 to 40 microns thick.

The core material 22 has a dielectric material 24 applied to both sides of the metal core to serve as insulation between the layers of a multi-layer electronic circuit package. The dielectric material may be photoimageable or nonphotoimageable and may be applied in one of several ways, including spraying, lamination, screening, or dipping. In the preferred embodiment of the invention, the dielectric material is a silica filled poly(tetrafluoroethylene) ("PTFE") composite. In the preferred embodiment of the invention, the dielectric material is applied to both sides of the core material.

An adhesive polymer has been applied over the dielectric material over the entire area of the panel. The adhesive polymer coating 26 protects the core and the dielectric material from infiltration of chemicals used in the fabrication process for the electronic circuit packages or for devices that use electronic circuit packages. The adhesive polymer, when selectively exposed, also serves to join panels in a multi-layer electronic circuit package. In the preferred embodiment of the invention, the adhesive polymer is PFA.

A cover sheet 28 has been placed over the adhesive polymer coating 26 on both sides of the panel. The cover sheet 28 in the preferred embodiment of the invention is made of copper material and is 9 microns thick. The cover sheet 28 is attached by the adhesive polymer coating 26. The panels 20 then are laminated. The lamination is not shown in FIG. 2. Through-holes and vias (not shown) are drilled in the panel. The through-holes and vias are seeded with a catalyst and plated with a joining metal 30.

A photo-resist (not shown) is applied and the area to be joined is defined by etching away the cover sheet 28 and removing the photo-resist to selectively expose the adhesive polymer layer 26. The exposed areas then may be used to attach components or other panels to form a multi-layer electronic circuit package.

FIG. 2 shows only a one panel metal core electronic circuit package. The typical high density electronic circuit package will have several such layers interleaved to form a multi-layer electronic circuit package.

What is claimed is:

1. An electronic circuit package having:

a core material;

a dielectric coating on both sides of the core material;

an adhesive polymer coated over both sides of the core material covering the entire area of the package; and a cover sheet on both sides of the package selectively etched away to reveal the adhesive polymer in areas to be joined.

2. The electronic circuit package of claim 1, wherein the adhesive polymer is poly(tetrafluoroethylene-perfluorovinyl ether).

3. The electronic circuit package of claim 1, wherein the dielectric coating is a silica filled poly(tetrafluoroethylene) composite.

4. The electronic circuit package of claim 1, wherein the coversheet is of a copper material.

5. The electronic circuit package of claim 1, wherein the core material is copper-Invar-copper.

* * * * *